(12) United States Patent
Chong et al.

(10) Patent No.: US 8,572,540 B2
(45) Date of Patent: Oct. 29, 2013

(54) METHOD AND SYSTEM FOR APPROXIMATE PLACEMENT IN ELECTRONIC DESIGNS

(75) Inventors: Philip Chong, Berkeley, CA (US); Christian Szegedy, Albany, CA (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 13/154,417

(22) Filed: Jun. 6, 2011

(65) Prior Publication Data

US 2011/0239177 A1    Sep. 29, 2011

Related U.S. Application Data

(62) Division of application No. 11/838,187, filed on Aug. 13, 2007, now Pat. No. 7,966,595.

(51) Int. Cl.
    *G06F 17/50*    (2006.01)
(52) U.S. Cl.
    USPC .................................. 716/118; 716/119
(58) Field of Classification Search
    USPC .................................. 716/118–125
    See application file for complete search history.

(56) References Cited

U.S. PATENT DOCUMENTS

| | | | |
|---|---|---|---|
| 5,636,129 A | 6/1997 | Her | |
| 5,661,663 A * | 8/1997 | Scepanovic et al. | 716/122 |
| 5,712,793 A * | 1/1998 | Scepanovic et al. | 716/124 |
| 5,909,376 A * | 6/1999 | Scepanovic et al. | 716/123 |
| 6,067,409 A | 5/2000 | Scepanovic | |
| 6,249,902 B1 | 6/2001 | Igusa et al. | |
| 7,073,144 B2 | 7/2006 | Alpert et al. | |
| 7,076,746 B2 | 7/2006 | Hamlin et al. | |
| 7,076,755 B2 | 7/2006 | Ren et al. | |
| 7,266,796 B1 | 9/2007 | Chu et al. | |
| 7,739,644 B1 | 6/2010 | Chong | |
| 2003/0079192 A1 * | 4/2003 | Cheong et al. | 716/7 |
| 2003/0084416 A1 * | 5/2003 | Dai et al. | 716/7 |
| 2007/0204252 A1 | 8/2007 | Furnish et al. | |

OTHER PUBLICATIONS

Alpert et al., "Faster Minimization of Linear Wirelength for Global Placement," ISPD 1997, pp. 4-11.
Alpert et al., "Placement Stability Metrics," 2005 IEEE, pp. 1144-1147.
Brenner et al., "Legalizing a Placement with Total Minimum Movement," IEEE Trans. on CAD of ICs and Systems, vol. 23, No. 12, Dec. 2004, pp. 1597-1613.
Caldwell et al., "Can Recursive Bisection Alone Produce Routable Placement?", DAC 2000, pp. 477-482.

(Continued)

*Primary Examiner* — Binh Tat
(74) *Attorney, Agent, or Firm* — Vista IP Law Group, LLP

(57) ABSTRACT

Disclosed are method, system, and computer program product for a method and system for a fast and stable placement/floorplanning method that gives consistent and good quality results. Various embodiments of the present invention provide a method and system for approximate placement of various standard cells, macro-blocks, and I/O pads for the design of integrated circuits by approximating the final shapes of the objects of interest by one or more probability distribution functions over the areas for the objects of interest with improved runtime and very good stability. These probability distributions are gradually localized to final shapes satisfying the placement constraints and optimizing an objective function.

22 Claims, 10 Drawing Sheets

(56) References Cited

OTHER PUBLICATIONS

Chong et al., "A Morphing Approach to Address Placement Stability," ISPD '07, Mar. 18-21, 2007, Austin, Texas, pp. 95-102.

Heckbert, P.S. "Fundamentals of texture mapping and image warping," Master's thesis, University of California, Berkeley, 1989.

Kahng et al., "Architecture and Detailes of a High quality, Large-Scale analytical Placer," 2005 IEEE, pp. 890-897.

Kleinhans et al., "Gordian: VLSI Placement by Quadradtic Programming and Slicing Optimization," IEEE Trans. on CAD, vol. 10, No. 3, Mar. 1991, pp. 256-265.

Nam et al., "The ISPD2005 Placement Contest and Benchmark Suite," ISPD 2005, pp. 216-220.

Ren et al., "Diffusion-Based Placement Migration," DAC 2005, pp. 515-520.

Roy, J. et al, "Capo: Robust and Scalable Open-Source Min-Cut Floorplacer" ISPD '05, Apr. 3-6, 2005, San Francisco, CA, pp. 224-226.

Sechen et al., "The TimberWolf Placement and Routing Package," IEEE Journal of Solid-State Circuites, vol. SOC-20, No. 2, Apr. 1985, pp. 510-522.

Sigl et al., "Analytical Placement: A Linear of a Quadratic Objective Function?", 28th ACM/IEEE Design Automation Conference, pp. 427-432.

Tsay et al., "Proud: A Sea-of-Gates Placement Algorithm," 1988 IEEE Design & Test of Computers, pp. 44-56.

Viswanathan et al., "FastPlace: Efficient Analytical Placement using Cell Shifting, Iterative Local Refinement and a Hybrid Net Model," ISPD 2004, pp. 26-33.

Vygen, "Algorithms for Large-Scale Flat Placement," DAC 1997, 6 pages.

Xiu, Z. et al, "Large-Scale Placement by Grid-Warping" Design Automation Conference, 2004, Proceedings, 41st, 2004, pp. 351-356.

Non-Final Office Action dated Mar. 5, 2010 for U.S. Appl. No. 11/838,187.

Notice of Allowance dated Oct. 19, 2009 for U.S. Appl. No. 11/838,193.

Final Office Action dated Apr. 29, 2009 for U.S. Appl. No. 11/838,193.

Notice of Allowance dated Feb. 5, 2010 for U.S. Appl. No. 11/838,193.

Final Office Action dated Sep. 1, 2010 for U.S. Appl. No. 11/838,187.

Advisory Action dated Nov. 26, 2010 for U.S. Appl. No. 11/838,187.

Notice of Allowance dated Feb. 16, 2011 for U.S. Appl. No. 11/838,187.

Non-Final Office Action dated Feb. 16, 2011 for U.S. Appl. No. 12/188,599.

Notice of Allowance dated May 27, 2011 for U.S. Appl. No. 12/188,599.

\* cited by examiner

METHOD AND SYSTEM FOR APPROXIMATE PLACEMENT IN ELECTRONIC DESIGNS

CROSS REFERENCE TO RELATED APPLICATION(S)

This application constitutes a divisional application of U.S. application Ser. No. 11/838,187, now U.S. Pat. No. 7,966,595, filed Aug. 13, 2007 and entitled "METHOD AND SYSTEM FOR APPROXIMATE PLACEMENT IN ELECTRONIC DESIGNS", the contents of which are hereby expressly incorporated by reference in their entireties.

BACKGROUND AND SUMMARY

Placement is one of the most fundamental problems in physical design flow since it assigns exact locations for various circuit components within the chip's core area. An inferior placement of the components may not only affect the chip's performance but also its manufacturability. For example, inferior placement assignment may produce excessive wirelength which may be beyond the available routing resources. As a result, the placer must perform such assignment while optimizing one or more objectives of the circuit to ensure that it meets the design requirements such as wirelength, density, power, timing, and many others.

A placer generally takes a netlist from logic synthesis and a technology library to produce a placement layout. The netlist is typically composed of a number of nets together with various components such as standard cells, macro blocks, or I/O pads. There have been several established techniques for standard cell placement, macro placement, and floorplanning with different objectives taken into account. Current placement approaches typically fall into the following categories: (1) minimum cut/partitioning based methods, (2) quadratic programming based methods, (3) force based placement methods, (4) analytic placement methods, and (5) simulated annealing based methods.

A minimum cut/partitioning placer recursively partitions, in a top down hierarchical fashion, a netlist into $2^n$ partitions, where $n \geq 1$. In addition to partitioning a netlist into partitions, a minimum cut/partitioning placer also recursively subdivides the layout area into a number of bins and assigns each of the netlist partitions into one of the bins. A bisection is achieved through either a horizontal or a vertical cut through the layout area during bin dividing. A quadrisection is achieved through simultaneous horizontal and vertical cuts through the layout area.

Quadratic programming based methods seek to minimize quadratic wirelength objectives or to optimize other quadratic objectives. Compared to the other placement/floorplanning methods, the quadratic programming based methods are relatively fast, and the stability is reasonably good. The quality of the results is, however, inconsistent.

In the conventional force-directed placement method, the forces are related to the number of connections among the modules. Based upon some criteria such as the area density of the placement, the force-based placement methods add wire length dependent forces or other additional forces to the cells to consider the placement area and particularly to reduce cell overlaps. Such force-based or force-directed placement methods seem to give good stability with quality of the results inferior to that of the analytical methods. The drawback on the force-based methods is that such methods tend to be very slow in reaching the final results.

The analytic placement methods capture the placement problems mathematically and use efficient numerical solvers to solve the problems within practical runtime. Although analytic placement methods usually exhibit good stability and give arguably the best quality final results, these methods tend to converge at a much slower speed than the min-cut/partitioning based placement methods or the quadratic programming based methods do.

Simulated annealing methods generally start from an initial configuration and iteratively move towards new configurations by displacing, swapping, or reorienting the cells until some criteria are met. During each iteration, a random transition from the current configuration to a new configuration is generated. Such a transition is accepted if, as a result of this transition, one or more objectives of the circuit is probabilistically improved. Otherwise, such a transition is probabilistically rejected. These simulated annealing methods not only do not significantly improve the netlength, but also tend to reach the final results at an extremely slow speed.

However, partitioning based methods tend to be fast but exhibit low stability and inconsistent quality. Quadratic programming based placers, although slower than partitioning based methods, are relatively fast and exhibit good stability with respect to input changes. Their quality, however, is generally inferior to that of analytic methods. Force based placers provide very good stability but are relatively slow and do not work well in the presence of large blocks. Their quality typically lags behind that of analytic placement engines. Simulated annealing based placement methods are extremely slow without significantly improving the netlength. Analytic methods tend to have the best netlength on practical designs but are generally much slower than partitioning or quadratic programming based methods, and the incorporation of different objectives is relatively hard. They tend to perform sub-optimally on designs with regular structure.

Thus, a need exists for a method, system, and computer program product for a fast and stable placement/floorplanning method that gives consistent and good quality results. Various embodiments of the present invention provide a method and system for approximate placement of various standard cells, macro-blocks, and I/O pads for the design of integrated circuits by approximating the final shapes of the objects of interest by one or more probability distribution functions over the areas for the objects of interest with improved runtime and very good stability. These probability distributions are gradually localized to final shapes satisfying the placement constraints and optimizing an objective function.

In some embodiments of the present invention, the aforementioned methods also estimate the final quality of the placement of various standard cells, macro-blocks, and I/O pads. Yet in some other embodiments of the present invention, the aforementioned methods are interleaved with global optimization steps to optimize various objectives according to currently available information and can be naturally combined with the multi-level paradigm. Aside from the advantages of improved runtime and stability, various embodiments of the present invention also allow for incorporating difficult constraints and/or objective functions. Furthermore, although various embodiments of the present invention find their application primarily in electronic design automation, some embodiments of the present invention in other applications where the locations of objects within a specified region or space need to be determined such that the locations optimize some cost functions.

Further details of aspects, objects, and advantages of some embodiments of the invention are described below in the detailed description, drawings, and claims. Both the foregoing general description and the following detailed description are exemplary and explanatory, and are not intended to be limiting as to the scope of various embodiments of the invention.

BRIEF DESCRIPTION OF THE FIGURES

The accompanying drawings are included to provide a further understanding of some embodiments of the invention and, together with the Detailed Description, serve to explain the principles of some embodiments of the invention.

DETAILED DESCRIPTION

Figure 1:
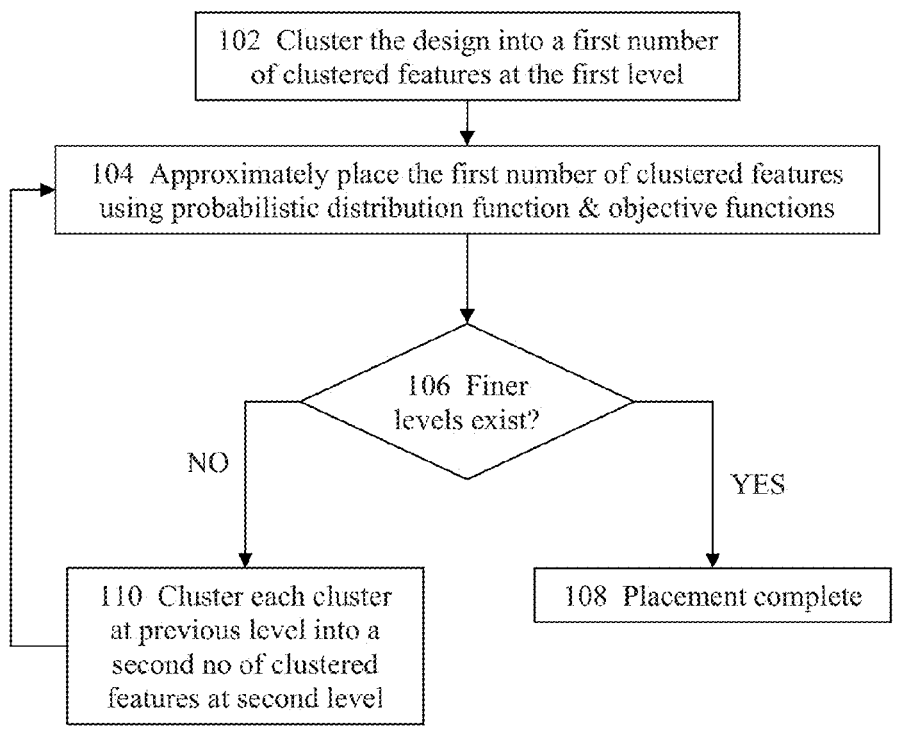
FIG. 1 illustrates an example of a method for multiple level placement of objects of interest utilizing the method of approximate placement.

Various embodiments of the invention provides a method, system, and computer program product for a fast and stable placement/floorplanning method that give consistent and good quality results.

Various embodiments of the invention provide for a method for approximate placement of objects of interest such as various standard cells, macro-blocks, and I/O pads for the design of integrated circuits by approximating the final shapes (i.e., locations) of the objects of interest by a gradually localized probability distribution function over the chip area with improved runtime and very good stability. In addition to approximating the final result, some embodiments further estimate the final quality of the placement, while some other embodiments further globally optimize placement over the entire chip area. These probability distributions are gradually localized to final feasible shapes satisfying the placement constraints and simultaneously optimizing one or more objective functions of standard cell placement, macro placement, or floorplanning. Such objective functions may include, but are not limited to, optimization of netlength, placement density, timing constraints, and routability. Some embodiments of the invention apply to floorplanning, placement, and other areas where the locations of objects within a specified region or space need to be determined such that the final locations optimize some cost functions. Some embodiments employ a method to find refining sequences of approximate placements for each object of interest in a greedy manner.

An important aspect of some embodiments of the invention address another goal of the placement and floorplanning techniques which are aimed to determine the exact shapes for the objects of interest subject to the constraints imposed by the techniques while minimizing some objective functions. These constraints include, for example, the requirement of translation of the shape of the master cell for standard cells, the requirement that an area be prescribed with minimum width and/or height, the requirement that different orientations of the master macroblocks may be allowed, and the requirement that some shapes may be constrained to certain sub-regions of the whole placement area such as in the case of voltage islands. Some embodiments of the invention allows for easier incorporation of these often tight constraints.

Some embodiments of the invention achieves their intended purposes by using gradually locally probability distributions to approximately place objects of interest. An approximate placement may be viewed as a positive valued function over the placement area. One of the types of the positive valued functions is a probabilistic distribution function which, for each point in the potential area, represents the estimated probability of this point being covered by the object of interest in the final placement. The final placement may be defined as the approximate placement that is the characteristic function of a valid shape for a particular object of interest.

Referring to FIG. 1 which illustrates an example of a method for multiple level placement of objects of interest utilizing the method of approximate placement. According to some embodiments of the invention, at 102, the method first clusters or partition the design into smaller number of objects to be placed. These objects may be, for example but shall not be limited to, super gates or maximal super gates. Thus, after step 102, the design is clustered or partitioned into a first number of groups of objects of interest to be placed at the first level. At 104, the method then employs a method to approximately place the first number of groups of objects of interest by using some distribution functions for each object of interest at the first level with the aid of certain objective functions. For example, one embodiment of the present invention may employ the probabilistic distribution function over the area for each of the object of interest at the first level to approximately place the object of interest while optimizing certain objective functions. More details about this approximate placement of objects of interest will be discussed in further details in subsequent sections.

Once all of the objects of interest at the first level are approximately placed at 104, the method then checks to determine whether there are finer levels within the first level objects of interest at 106. If the method determines that there are no finer levels existing in any of the first level objects of interest, the method proceeds to 108 where the placement/floorplanning is complete. On the other hand, if the method determines that there are finer levels in some of the first level objects that require further placement at these finer levels, the method proceeds to 110 to further cluster or partition each object of interest comprising finer levels into a second number of clustered objects of interest at a second level. The method then forwards the second level objects of interest to 104 where these second level objects will be approximately placed with the aid of the same or different objective functions.

Figure 2A:
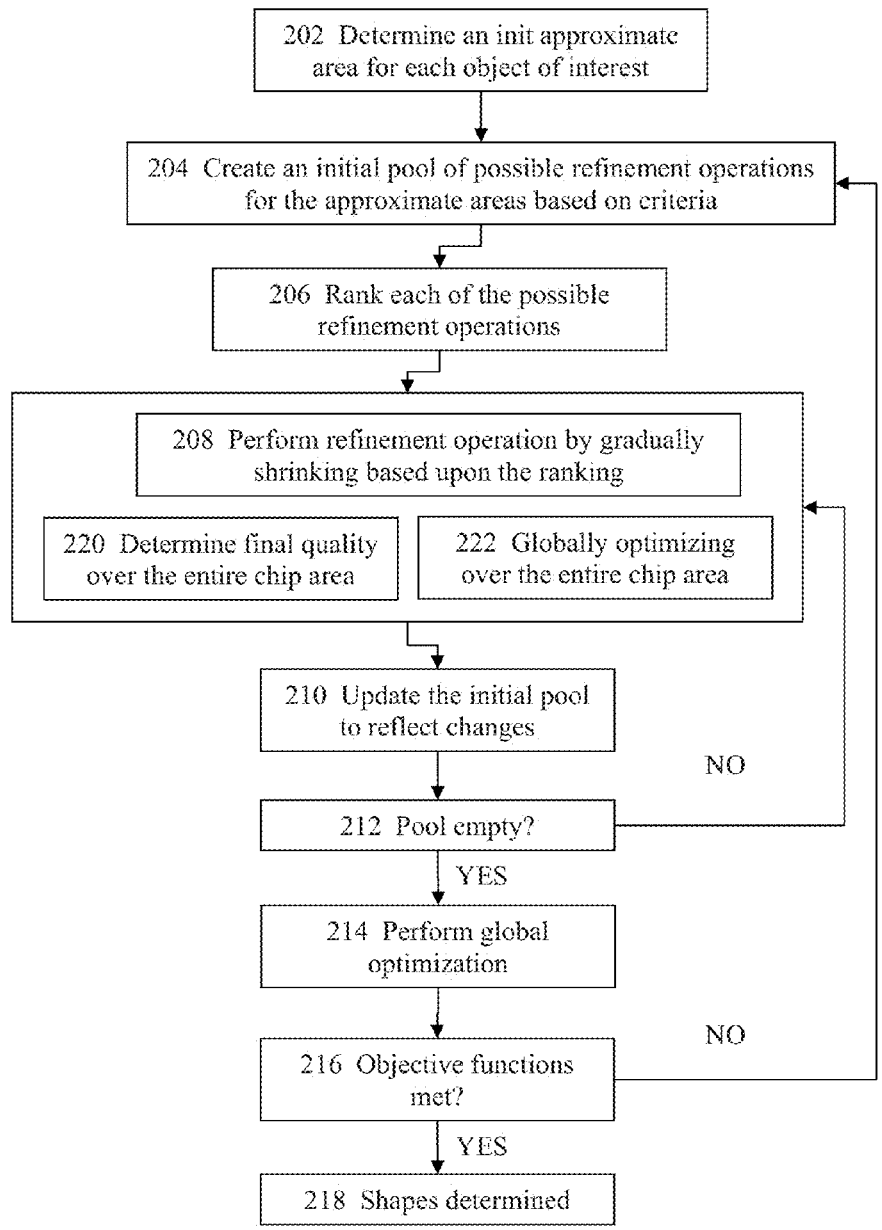
FIG. 2A illustrates an example of a method for placing various objects of interest over an area utilizing the approximate placement technique.

Referring to FIG. 2A which illustrates an example of a method for placing various objects of interest over an area utilizing the approximate placement technique. Some embodiments address the problem that the fidelity of the objective function estimates can be high, but the lack of information at preliminary stages may prevent us from making globally optimal decisions when the potential areas are large. This type of problem may be caused be the highly non-local nature of probability functions. As such, some embodiments of the invention use global optimization algorithms interleaved with area refinement.

According to some embodiments of the invention, the approximate placement represents a positive real valued function over the placement area which may be a sub-region of the chip area. In some other embodiments, the approximate placement represents the estimated probability of a specified point being covered by the object of interest in the final placement which constitutes one instance of approximate placement. In these embodiments, the integral of the probability distribution function over the placement area represents the prescribed area of the associated object of interest. Furthermore, in these embodiments, the final placement usually represents the last approximate placement for an object of interest in the refining sequence and constitutes the characteristic function of a valid shape for a particular object of interest.

According to some embodiments of the invention, the method first assigns an initial approximate area for each object of interest to be placed at 202. Then, at 204, the method creates an initial pool of possible refinement operations which may be applied to the initial approximate areas of the objects of interest. Some embodiments may apply one possible refinement operation to a individual object of interest, while some other embodiments may lump multiple possible refinement operations into one aggregated refinement operation. The method then proceeds to 206 to determine the score for each of the possible refinement operations in the initial pool. At 208, the method invokes and performs one or more of the possible refinement operations. For example, based upon the scores of the possible refinement operations, some embodiments perform the one or more refinement operations by gradually shrinking the area for the object of interest. Some other embodiments may choose the refinement operations with the highest scores.

Some embodiments may perform step 208 together with step 222 where the refinement operation is interleaved with a global optimization algorithm over the entire chip area. Yet in some other embodiments, the refinement operations are interleaved with a global optimization step that translates the approximate placement of the objects of interest. Yet in some other embodiments, the refinement operations are also interleaved with a algorithm to determine the final quality over the entire chip area, 220, while performing the refinement operations. In some embodiments, the method may allow for excessive utilization of the area for an object of interest. Yet in some other embodiments, the method may further employ certain techniques to reduce excessive utilization. These techniques may include, but are not limited to, techniques often used in legalization or final placement. Furthermore, some embodiments may allow for some overlaps among the areas for objects of interest. Nonetheless, some other embodiments may employ techniques such as those used in placement legalization to reduce the overlaps.

At step 210, the method then updates the initial pool of possible refinement operations to reflect changes. Some embodiments update all of the iterations after the performance of each refinement operation. Some other embodiments update only the iterations over the areas for the objects of interest that are affected by the previous refinement operation. Yet in some other embodiments, the pool of possible refinement operations may be viewed as a priority queue and can be implemented as a k-nary or Fibonacci heap to allow for fast update and removal of operations while guaranteeing fast queries at the same time. At step 212, the method checks to determine whether the pool is empty. If the pool is determined to be non-empty, the method then goes back and repeat the refinement (208, 220, and 222), updating (210), and checking and determining (212) steps. The method then go through the iterative process until the pool of possible refinement operations is empty. Where the pool of possible refinement operations is determined to be empty, some embodiments may optionally perform a global optimization at 214 and determines whether certain objective functions are met at 216. These objective functions may comprise, but are not limited to, netlength, local density, routing capacity, and timing estimate. Further details about the density functions will be described in subsequent sections. Where the objective functions are met, the method proceeds to step 218 where a valid shape is determined for the each of the objects of interest.

For global optimization algorithm interleaved with approximate placement, the following optimizations have proved to be particularly useful. For example, some embodiments may perform local optimization of netlength while taking the density map into account by employing a method to perform a separate loop of iterations which only moves the potential areas but does not shrink them. Each potential area is moved to some location which optimizes the estimated netlength but does not introduce (or worsen) density violations. To further optimize netlength, the method may optionally optimize the netlength by solving partitioning problems to distribute objects of interest into two areas that are separated by a large blocked region. The same method can be applied in the case of several voltage islands, where the cells can be placed in different discrete sets of regions. Yet some other embodiments may further employ an optional step to address the previously underestimated density problems by using different density removal such as flow or morphing based techniques that remove the estimated overload globally.

Moreover, the potential areas represent more relaxed areas for objects of interest and are typically given by the following means. For example, some embodiments may obtain the potential areas from analytical formulae such as normal distributions with certain parameters. Some other embodiments may obtain the potential areas from a list of planar polygons each of which is associated with an associated weight of positive real value. The functions specified by them is the weighted sum of their characteristic functions. Yet some other embodiments may obtain the potential areas from a sum of functions of the above two forms.

Figure 2B:
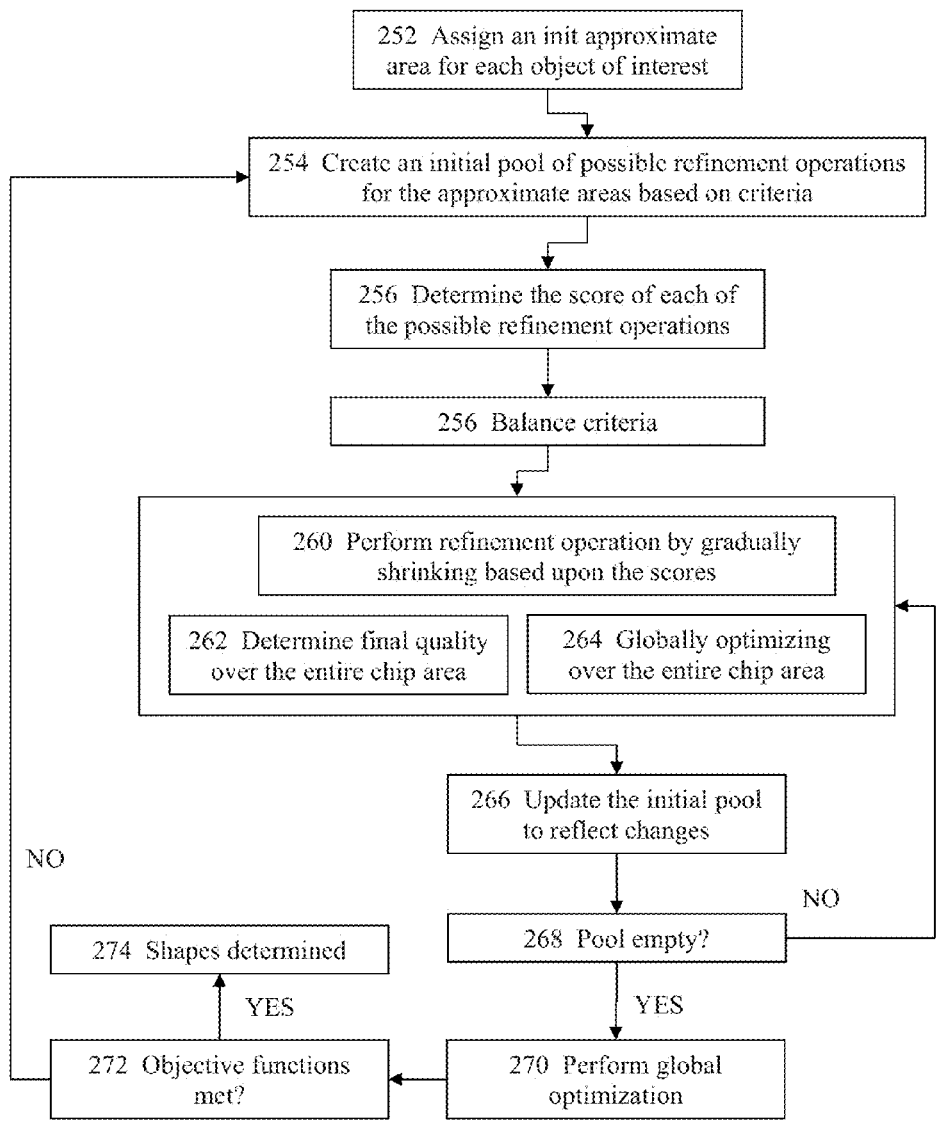
FIG. 2B illustrates an example of a similar method for placing various objects of interest over an area utilizing the approximate placement technique.

Referring to FIG. 2B which illustrates an example of a similar method for placing various objects of interest over an area utilizing the approximate placement technique. According to some embodiments of the invention, the approximate placement represents a positive real valued function over the placement area which may be a sub-region of the chip area. In some other embodiments, the approximate placement represents the estimated probability of a specified point being covered by the object of interest in the final placement which constitutes one instance of approximate placement. In these embodiments, the integral of the probability distribution function over the placement area represents the prescribed area of the associated object of interest. Furthermore, in these embodiments, the final placement usually represents the last approximate placement for an object of interest in the refining sequence and constitutes the characteristic function of a valid shape for a particular object of interest.

According to some embodiments of the invention, the method first assigns an initial approximate area for each object of interest to be placed at 252. Then, at 254, the method creates an initial pool of possible refinement operations which may be applied to the initial approximate areas of the objects of interest. Some embodiments may apply one possible refinement operation to a individual object of interest, while some other embodiments may lump multiple possible refinement operations into one aggregated refinement operation. The method then proceeds to 256 to determine the score for each of the possible refinement operations in the initial pool. Where the possible refinement operations exhibit a monotonic series of scores while taking several objectives into consideration, the method may, as in step 206 in FIG. 2A, proceed directly to step 260. On the other hand, where the scores of the possible refinement operations exhibit some conflict among different objectives, some embodiments may further employ one or more balance criteria to determine which refinement operation should be performed for a particular area for an object of interest at 258. Some other embodiments may choose the refinement operation based upon the designer's input after the conflicts among the different objectives are optionally presented to the designer. After the refinement operation is determined, the method proceeds to 260. At 260, the method invokes and performs one or more of the possible refinement operations. For example, based upon the scores of the possible refinement operations, some embodiments perform the one or more refinement operations by gradually shrinking the area for the object of interest. Some other embodiments may choose the refinement operations with the highest scores.

Some embodiments may perform step 260 together with step 264 where the refinement operation is interleaved with a global optimization algorithm over the entire chip area. Yet in some other embodiments, the refinement operations are also interleaved with a algorithm to determine the final quality over the entire chip area, 262, while performing the refinement operations. In some embodiments, the method may allow for excessive utilization of the area for an object of interest. Yet in some other embodiments, the method may further employ certain techniques to reduce excessive utilization. These techniques may include, but are not limited to, techniques often used in legalization or final placement. Furthermore, some embodiments may allow for some overlaps among the areas for objects of interest. Nonetheless, some other embodiments may employ techniques such as those used in placement legalization to reduce the overlaps.

At step 266, the method then updates the initial pool of possible refinement operations to reflect changes. Some embodiments update all of the iterations after the performance of each refinement operation. Some other embodiments update only the iterations over the areas for the objects of interest that are affected by the previous refinement operation. Yet in some other embodiments, the pool of possible refinement operations may be viewed as a priority queue and can be implemented as a k-nary or Fibonacci heap to allow for fast update and removal of operations while guaranteeing fast queries at the same time. At step 268, the method checks to determine whether the pool is empty. If the pool is determined to be non-empty, the method then goes back and repeat the refinement (260, 262, and 264), updating (266), and checking and determining (268) steps. The method then go through the iterative process until the pool of possible refinement operations is empty. Where the pool of possible refinement operations is determined to be empty, some embodiments may optionally perform a global optimization at 270 and determines whether certain objective functions are met at 272. These objective functions may comprise, but are not limited to, netlength, local density, routing capacity, and timing estimate. Further details about the density functions will be described in subsequent sections. Where the objective functions are met, the method proceeds to step 274 where a valid shape is determined for the each of the objects of interest.

Figure 3:
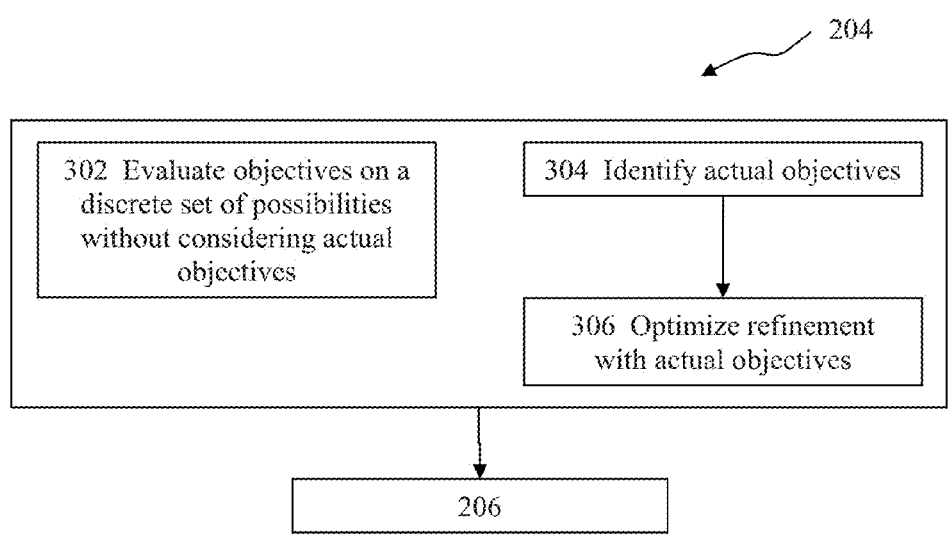
FIG. 3 illustrates an example of the performing refinement operation step in the method for placing various objects of interest over an area utilizing the approximate placement technique.

Referring to FIG. 3 which illustrates an example of the performing refinement operation step in the method for placing various objects of interest over an area utilizing the approximate placement technique. FIG. 3 depicts two ways of determining the scores of refinement operations. Some embodiments may, as in 302, evaluate the objective functions against a discrete set of possibilities. Some other embodiments may evaluate the objective functions against such a discrete set of possibilities without taking into account the actual objectives. Some other embodiments may first identify some actual design objectives, as in 304, and then try to identify an optimal local refinement of approximate placement, as in 306. Yet some other embodiments may evaluate the refinement operations with a combined approach of the above two methods.

Figure 4:
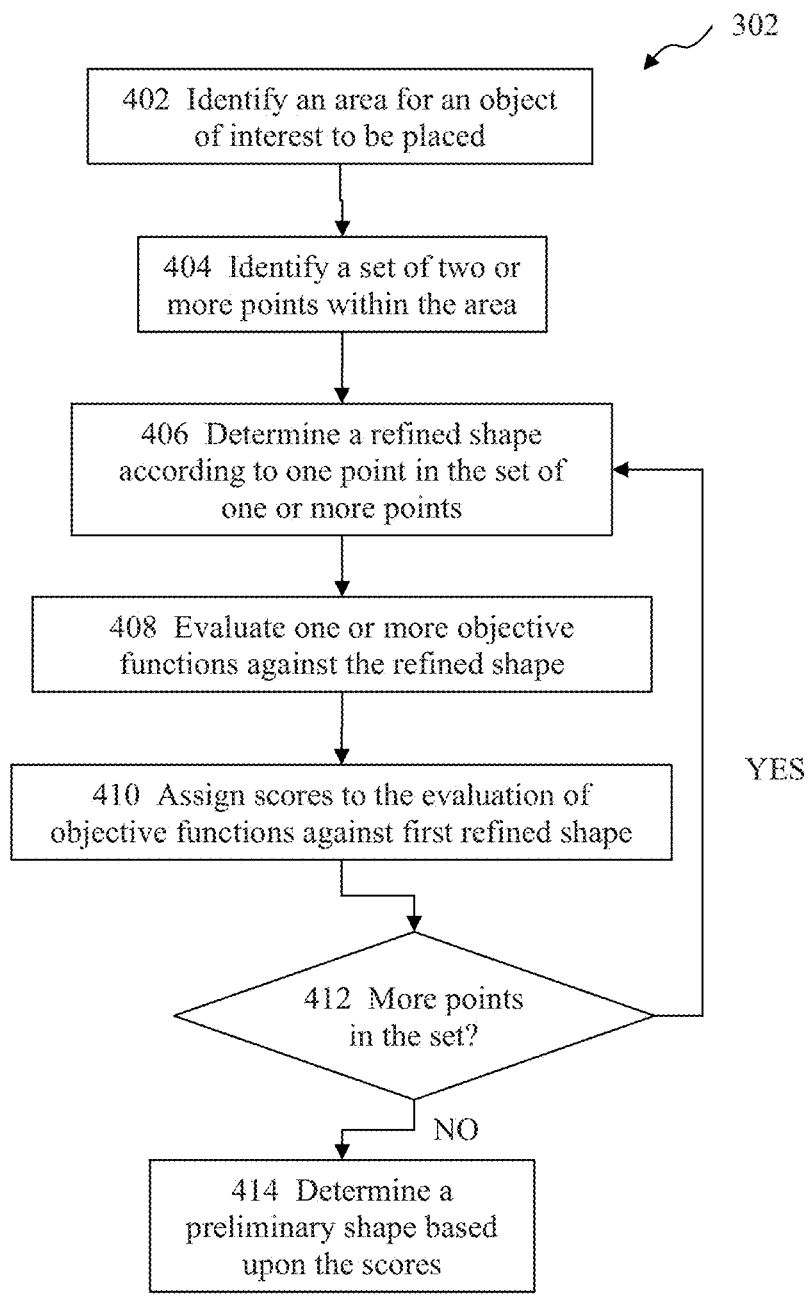
FIG. 4 illustrates an example of a method for evaluating refinement operations.

Referring to FIG. 4 which illustrates an example of a method for evaluating refinement operations. According to some embodiments, the method identifies an area for an object of interest to be placed at 402. At 404, the method identifies a set of two or more points, e.g., the first point and the second point, within the above area for an object of interest to be placed. At 406, the method determines a gradually refined shape based upon the first point in the set and some objectives. For example, let us assume that at a given point during the refinement process the approximate placement of an object of interest is a rectangular region. The goal of 406 is then to replace the rectangular region with some smaller region of a certain shape. Some embodiments may employ a method to first identify some points within the rectangular region. For example, the method may identify some or all of the four corners and the center of the rectangular region. Shrinking the rectangular region to each of these identified points represents a possible refinement operation. Then the method shrinks the rectangular region to the identified corner points and center point and evaluates certain objectives for each of the possible refinement operations.

At 408, the method evaluates one or more objective functions against the localized gradually refined shape. As FIG. 6 suggests, the objective functions may comprise, for example but are not limited to, the local replacement density 602, netlength 608, the routing capacity 614, and timing estimation 620.

Referring back to FIG. 4. The method then assigns scores to the evaluation of the one or more objective functions against the localized gradually refined shape at 410. At 412, the method then checks to determine whether there are more points in the set. If no more points exist in the set to determine a localized gradually refined shape, the method proceeds to 414 to determine a preliminary shape based upon the scores previously determined at step 410. If there exist one or more points to determine a localized gradually refined shape, the method goes back to step 406, and repeat the process.

Figure 5:
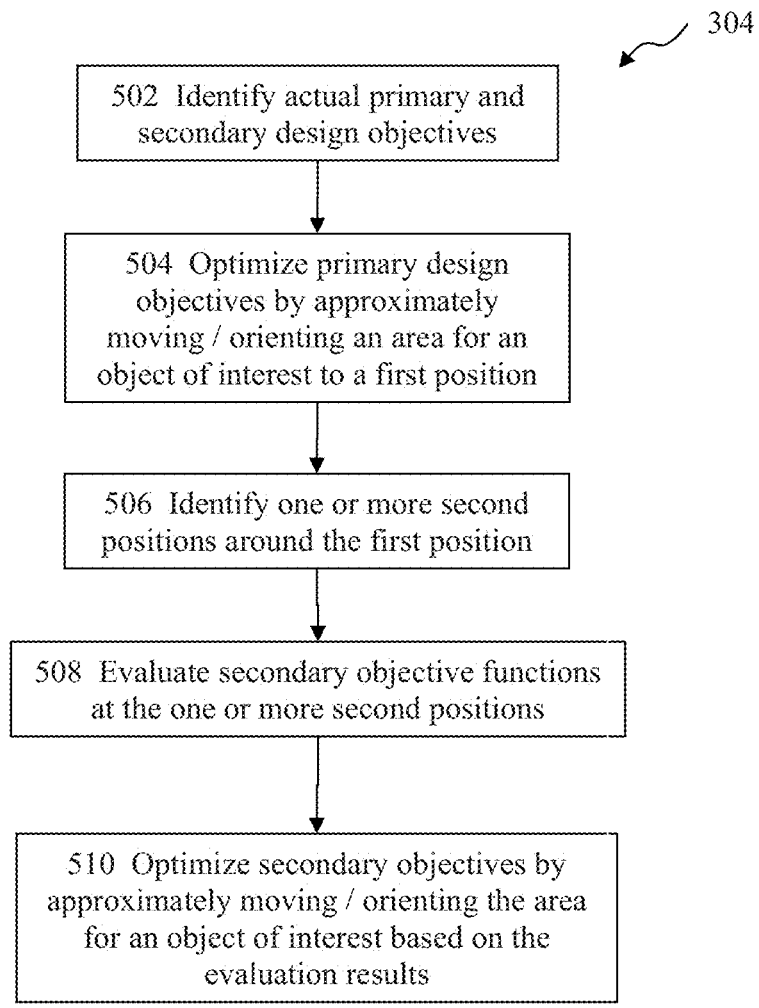
FIG. 5 illustrates an example of another method for evaluating refinement operations.

Referring to FIG. 5 which illustrates an example of another method for evaluating refinement operations. According to some embodiments, the method identifies at least one primary design objective and at least one secondary design objective at 402. In the alternative, the method may identify one or more objectives and at least one primary objectives among the one or more objectives. For example, the primary objective may be to minimize wirelength, and the secondary objective may be to optimize placement density for a particular design. Some other embodiments take the designer's input in identifying the primary and secondary objectives. At 504, the method then optimizes the at least one primary design objective by moving, orienting, or by combination of moving and orienting an area for an object of interest to a first position or orientation.

The method then starts a local search around the first position or orientation to identify at least one second position or orientation at 506. The method then evaluates the other objectives or the secondary objectives at the at least one second position or orientation at 508. At 510, the method then optimizes the other objectives or the secondary objectives by approximately moving or orienting the area for an object of interest based on the evaluation results.

An illustration of this method for evaluating refinement operations can be described as follows. Some embodiments employ a method to first identify certain objectives such as optimizing wirelength, vialength, routability, timing, and placement density. The method then identifies one or more primary objectives. Let us assume the method identifies one primary objective as to optimize the wirelength. The method then seeks to optimize the primary objective of minimizing the wirelength by translating, orienting, or by both moving and orienting the area of an object of interest to a first position and/or orientation. Then the method starts a local search around this first position and/or orientation to identify one or more second positions and/or orientations. The method then evaluates the rest of the identified objectives at these second positions and/or orientations and chooses the second position and/or orientation that best optimize the rest of the objectives.

Note that this method may be preferred where more information about the final layout of the design is available and constraints may be too stringent to expect good results by simpler designs. In cases like this, this method illustrated in FIG. 5 may be preferred over the method illustrated in FIG. 4. Furthermore, this method is more feasible where the potential areas for objects of interest are given by analytic formulae or lists of regions or weight regions. Moreover, potential areas given by different methods may result in better estimation of different objective functions. For example, where the potential areas are given by analytic functions, the expected value for the half perimeter bounding box netlength may be computed explicitly and thus improve the quality of the overall solutions.

Figure 6:
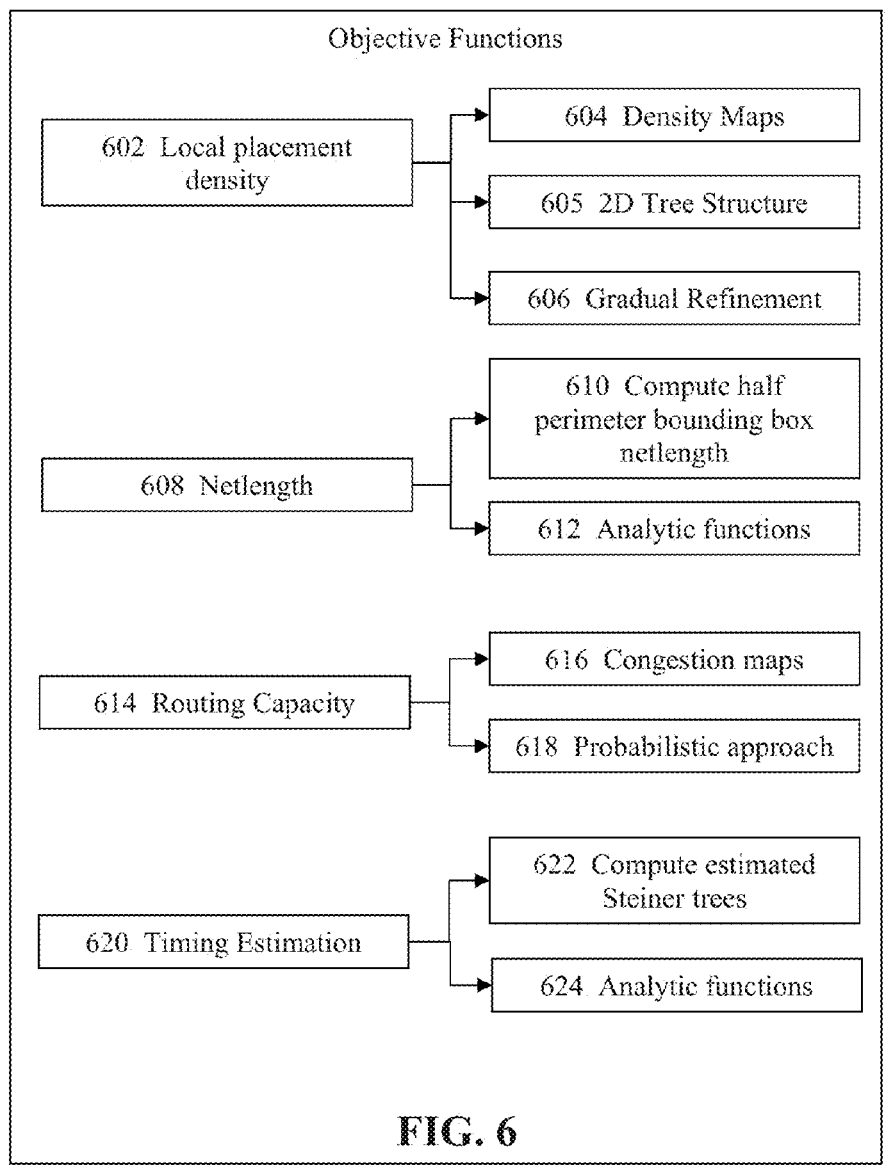
FIG. 6 illustrates some examples of various design objectives.

Referring to FIG. 6 which illustrated some examples of various design objectives. Such design objectives may comprise local placement density 602, netlength 608, vialength (not shown), routing capacity 614, and timing estimation 620.

More specifically, some embodiments may employ a method that uses density maps to measure the local density, 604. The density maps may be implemented by a simple matrix where each entry holds a real number specifying the placement density of the associated region. Querying density maps in this form is very fast, but updating it with large areas can be time consuming. Another way to do this is to use a two-dimensional tree structure to accelerate, 605, but querying may become slower. The latter may be preferred over the former method if the areas to be updated are generally significantly larger than the resolution of the grid, which is normally the case. Yet another way of accelerating the update is to gradually refine the resolution as the approximate placement is refined, 606. This method may avoid runtime penalty on the update operations.

For netlength, 608, where the potential areas consist of rectangles or weighted rectangles, some embodiments may employ a method to compute, for each net, the half-perimeter bounding box netlength of the net which is half of the perimeter of the smallest rectangle intersecting all potential areas of the terminals of the net, 610. Some other embodiments employ another method to compute Steiner netlength estimations by known heuristics or exact methods. A good estimation may be the length of a planar Steiner tree touching the potential areas of the terminals of each net. On the other hand, where the potential areas are given by certain analytic functions, the expected value for the half-perimeter bounding box netlength can be computed explicitly, 612. This method may improve the quality of the overall solutions by using such more exact estimation.

Some embodiments may employ a method to estimate routing capacity can by maintaining a congestion map similar to the above density maps, 616. Some other embodiments may employ another method which uses a probabilistic approach to estimate the contribution of one net to the overall routing congestion.

Some embodiments employ a method to estimate timing by computing estimated Steiner trees and use them for extraction within an external timing tool, 622. As in the case of netlength, if the potential areas are given by some analytic functions, then the expected value of certain electric parameters which may affect the timing can be computed explicitly, 624. This method may improve the quality of the overall solutions by using such more exact estimation.

Note that as a general rule, a good estimation for any of the above objective functions need not be exact. The estimation only needs to have good fidelity; that is, higher ranked solutions should lead to better expected final results.

Figure 7:
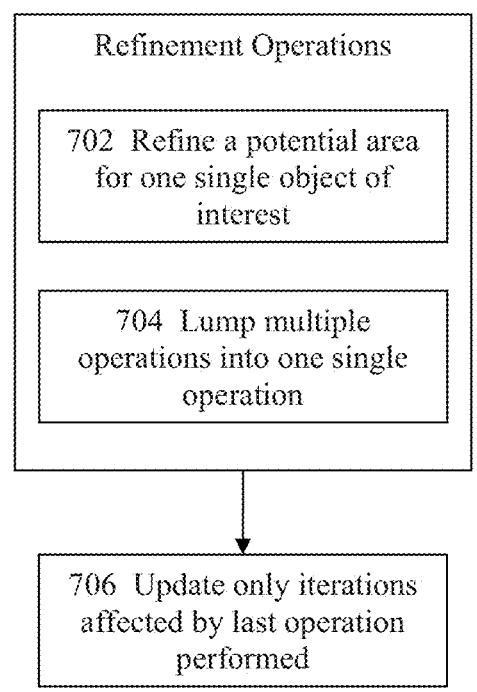
FIG. 7 illustrates an example of some refinement operations.
Figure 8A:
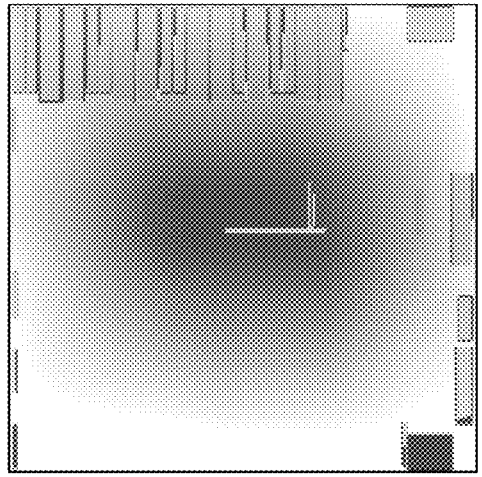
FIG. 8(a)-8(d) depict an example of the localized gradually refined approximate placement for the objects of interest.
Figure 8B:
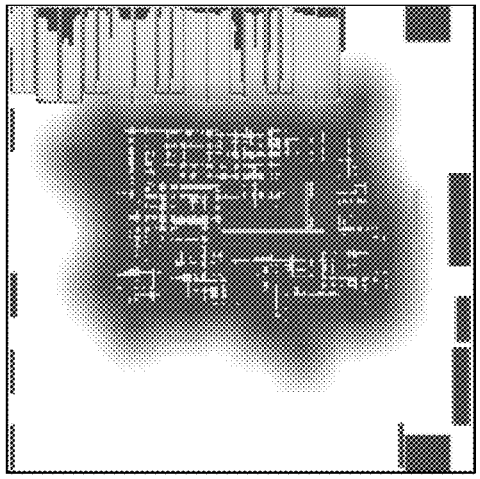
Figure 8C:
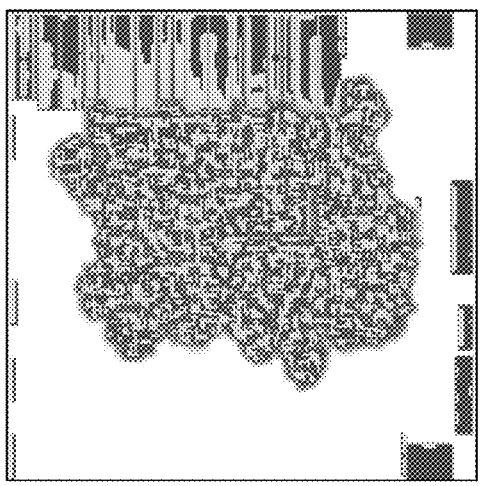
Figure 8D:
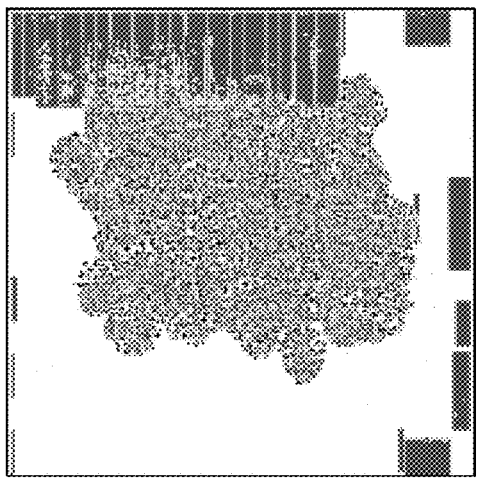

Referring to FIG. 7 which illustrates an example of some forms of the possible refinement operations. The possible refinement operations may have various forms. One basic form is the refinement for the potential area for one single object as in 702. Another form of these possible refinement operations may lump a larger set of possible refinement operations into one single operation as in 704. Operation lumping is generally useful if the success of the sub-operations are mutually dependent.

For example, the general minimum cut placement fits the above method by cutting the placement areas and partitioning the chip are into two halves which minimize the estimated connection between the two halves. This is equivalent to shrinking the potential areas of the objects of interest. The potential area of the first part is shrunk to, for example, the left half of the chip area, the other part is constrained to the right half. However, the approximate placement method as described in various embodiments is more general, and min-cut placement method may be considered as a special case of the more general approximate placement method.

On the other hand, if the initial pool of operations contains many different operations it then makes sense to update only those operations that are affected by the last performed operation. In this case, the initial pool of operations should be viewed as a priority queue and can be implemented as a, for example, k-nary or Fibonacci heap to allow for fast update and removal of operations while guaranteeing fast queries at the same time.

Referring to FIGS. 8(*a*) to 8(*d*). FIG. 8(*a*)-(*d*) depict an example of this successive iterations of approximate placement of objects of interest. In these figures, the areas are shaded according to the computed density based upon the probability distribution of the objects of interest. Areas with darker shades indicate higher density where white areas indicate 0% density. Some other embodiments may utilize different colors to indicate different density. For example, an embodiment may use red or other high contrast colors to indicate local density over 100%.

FIG. 8(*a*) illustrates the approximate placement of nearly all of the objects of interest after the first iteration. As it can be seen from the figure, nearly all the cells are spread widely across the die. FIG. 8(b) illustrates the approximate placement after the second iteration. As it can be seen from the figure that the areas of the probability distributions are refined using an objective function which minimize some objective functions. The refinement may allow for some small degrees of excessive utilization, or even over utilization because such excessive or over utilizations may be easily fixed with a final placement or legalization. FIGS. 8(c)-(d) illustrate the approximate placement after the third and fourth iterations. As it can be seen from these two figures, more objects of interest reach final placement as their corresponding probability distributions are shrunk down to the size of their valid shapes. Furthermore, overlaps between the macroblocks as shown in FIGS. 8(a)-(d) in the upper left hand corner and other objects of interest can be solved by placement legalization.

It will be appreciated by those of ordinary skill in the art that various embodiments of the invention can be embodied in other specific forms without departing from the spirit or essential character thereof. The presently disclosed embodiments are therefore considered in all respects to be illustrative and not restrictive. The scope of various embodiments of the invention is indicated by the appended claims rather than the foregoing description, and all changes which come within the meaning and range of equivalents thereof are intended to be embraced therein.

System Architecture Overview

In the following description, numerous details are set forth for purpose of explanation. However, one of ordinary skill in the art will realize that various embodiments of the invention may be practiced without the use of these specific details. In other instances, well-known structures and devices are shown in block diagram form in order not to obscure the description of various embodiments of the invention with unnecessary detail.

Figure 9:
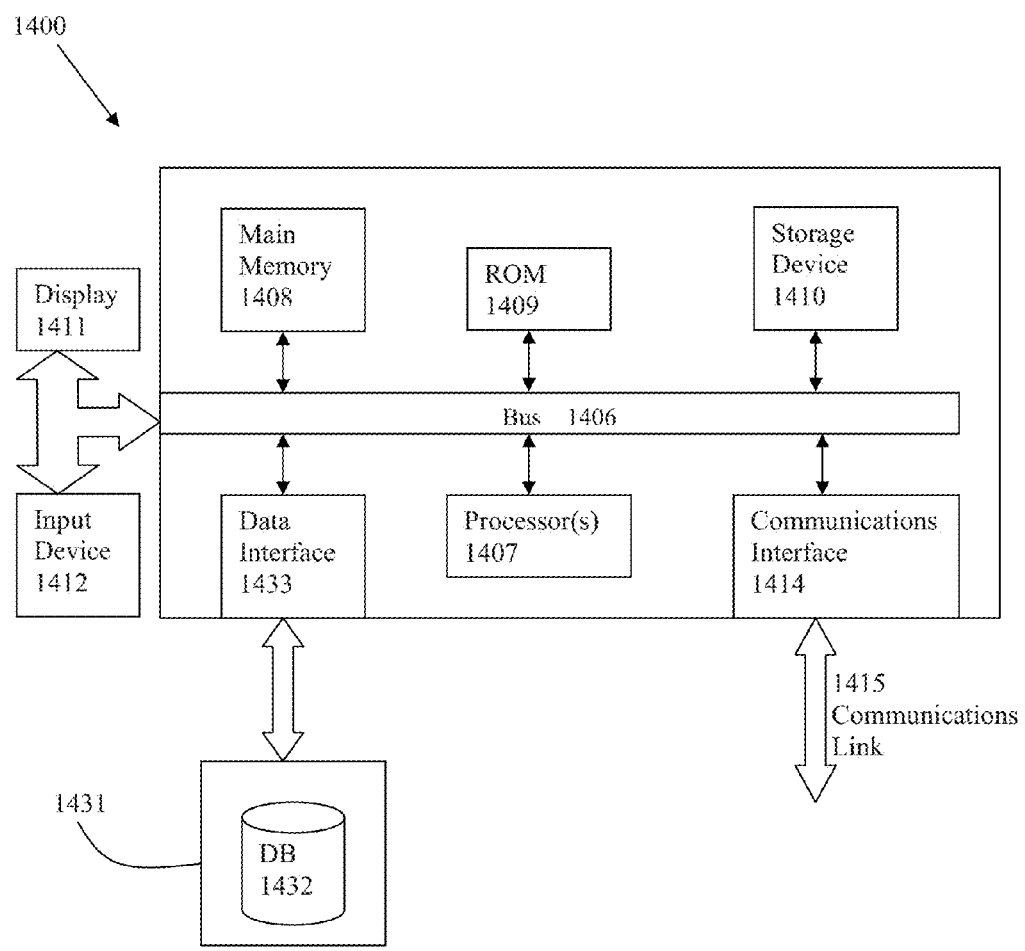
FIG. 9 depicts a computerized system on which a method for timing closure with concurrent process models can be implemented.

FIG. 9 is a block diagram of an illustrative computing system 1400 suitable for implementing an embodiment of the present invention. Computer system 1400 includes a bus 1402 or other communication mechanism for communicating information, which interconnects subsystems and devices, such as processor 1404, system memory 1406 (e.g., RAM), static storage device 1408 (e.g., ROM), disk drive 1410 (e.g., magnetic or optical), communication interface 1412 (e.g., modem or ethernet card), display 1414 (e.g., CRT or LCD), input device 1416 (e.g., keyboard), and cursor control 1418 (e.g., mouse or trackball).

According to one embodiment of the invention, computer system 1400 performs specific operations by processor 1404 executing one or more sequences of one or more instructions contained in system memory 1406. Such instructions may be read into system memory 1406 from another computer readable/usable medium, such as static storage device 1408 or disk drive 1410. In alternative embodiments, hard-wired circuitry may be used in place of or in combination with software instructions to implement various embodiments of the invention.

The term "computer readable medium" or "computer usable medium" as used herein refers to any medium that participates in providing instructions to processor 1404 for execution. Such a medium may take many forms, including but are not limited to, non-volatile media, and volatile media. Non-volatile media includes, for example, optical or magnetic disks, such as disk drive 1410. Volatile media includes dynamic memory, such as system memory 1406.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice various embodiments of the invention is performed by a single computer system 1400. According to other embodiments of the invention, two or more computer systems 1400 coupled by communication link 1420 (e.g., LAN, PTSN, or wireless network) may perform the sequence of instructions required to practice various embodiments of the invention in coordination with one another.

Computer system 1400 may transmit and receive messages, data, and instructions, including program, i.e., application code, through communication link 1420 and communication interface 1412. Received program code may be executed by processor 1404 as it is received, and/or stored in disk drive 1410, or other non-volatile storage for later execution.

In the foregoing specification, various embodiments of the invention have been described with reference to specific embodiments thereof. It will, however, be evident that various modifications and changes may be made thereto without departing from the broader spirit and scope of various embodiments of the invention. For example, the above-described process flows are described with reference to a particular ordering of process actions. However, the ordering of many of the described process actions may be changed without affecting the scope or operation of various embodiments of the invention. The specification and drawings are, accordingly, to be regarded in an illustrative rather than restrictive sense.

What is claimed is:

1. A computer-implemented method for a multi-level technique for approximately placing an object of interest, comprising:
   in a computing node comprising at least one processor, using the at least one processor to perform a process, the process comprising:
   clustering a design into a first number of clustered design features at a first level;
   determining a statistical distribution for a plurality of locations including a first location in the design;
   performing first approximate placement of the first number of clustered objects of interest, wherein the first approximate placement of the first number of clustered objects of interest corresponds to a first likelihood of the first location that the first location is covered by at least some of the first number of clustered objects of interest in a first final placement of the first number of clustered objects of interest in the design creating or identifying a first pool of approximate placement candidates for the first number of clustered objects of interest;
   updating the first pool of approximate placement based at least in part upon a result of refining the first approximate placement;
   determining whether a finer level exists within each of the first number of objects of interest at the first level; and
   clustering a clustered object of interest at the first level into a second number of clustered objects of interest at a second level, in which the object of interest at the first level comprises at least two objects of interest.

2. The computer-implemented method of claim 1, in which the first number of clustered design features at the first level comprises a super gate.

3. The computer-implemented method of claim 1, in which the first number of clustered design features at the first level comprises a maximum super gate.

4. The computer-implemented method of claim 1, wherein the second approximate placement of the second number of clustered objects of interest corresponds to a second likelihood of a second location that the second location is covered by at least some of the second number of clustered objects of interest in a second final placement of the second number of clustered objects of interest in the design.

5. The computer-implemented method of claim 1, the process further comprising:
determining a statistical distribution for a plurality of locations that include the first location in the design, wherein the second approximate placement of the second number of clustered objects of interest corresponds to a second likelihood of a second location that the second location is covered by at least some of the second number of clustered objects of interest in a second final placement of the second number of clustered objects of interest in the design.

6. The computer-implemented method of claim 1, the act of performing the first approximate placement of the first number of clustered objects of interest comprising:
refining the first approximate placement by using a localized gradually refined approximate placement for the first number of clustered objects of interest.

7. The computer-implemented method of claim 6, the process further comprising:
evaluating the first pool of approximate placement candidates based at least in part upon a first criterion for improving the design.

8. The computer-implemented method of claim 1, the process further comprising:
performing second approximate placement for the second number of clustered objects of interest.

9. A computer program product comprising a non-transitory computer-usable storage medium having executable code, which when executed by at least one processor, causes the at least one processor to execute a process for a multi-level approximately placing an object of interest, the process comprising:
in a computing node that comprises the at least one processor:
clustering a design into a first number of clustered design features at a first level;
determining a statistical distribution for a plurality of locations including a first location in the design;
perform a first approximate placement of the first number of clustered objects of interest, wherein the first approximate placement of the first number of clustered objects of interest corresponds to a first likelihood of the first location that the first location is covered by at least some of the first number of clustered objects of interest in a first final placement of the first number of clustered objects of interest in the design creating or identifying a first pool of approximate placement candidates for the first number of clustered objects of interest;
updating the first pool of approximate placement based at least in part upon a result of refining the first approximate placement;
determining whether a finer level exists within each of the first number of objects of interest at the first level; and
clustering a clustered object of interest at the first level into a second number of clustered objects of interest at a second level, in which the object of interest at the first level comprises at least two objects of interest.

10. The computer program product of claim 9, in which the first number of clustered design features at the first level comprises a super gate.

11. The computer program product of claim 9, in which the first number of clustered design features at the first level comprises a maximum super gate.

12. The computer program product of claim 9, the process further comprising:
determining a statistical distribution for a plurality of locations that include the first location in the design.

13. The computer program product of claim 9, the act of performing the first approximate placement of the first number of clustered objects of interest comprising:
refining the first approximate placement by using a localized gradually refined approximate placement for the first number of clustered objects of interest.

14. The computer program product of claim 13, the process further comprising:
evaluating the first pool of approximate placement candidates based at least in part upon a first criterion for improving the design.

15. The computer program product of claim 9, the process further comprising:
performing a second approximate placement of the second number of clustered objects of interest.

16. A computer system, comprising:
at least one processor that is to:
cluster a design into a first number of clustered design features at a first level;
determining a statistical distribution for a plurality of locations including a first location in the design;
perform first approximate placement of the first number of clustered objects of interest, wherein the first approximate placement of the first number of clustered objects of interest corresponds to a first likelihood of the first location that the first location is covered by at least some of the first number of clustered objects of interest in a first final placement of the first number of clustered objects of interest in the design creating or identifying a first pool of approximate placement candidates for the first number of clustered objects of interest;
updating the first pool of approximate placement based at least in part upon a result of refining the first approximate placement;
determine whether a finer level exists within each of the first number of objects of interest at the first level; and
cluster a clustered object of interest at the first level into a second number of clustered objects of interest at a second level, in which the object of interest at the first level comprises at least two objects of interest.

17. The computer system of claim 16, in which the first number of clustered design features at the first level comprises a super gate.

18. The computer system of claim 16, in which the first number of clustered design features at the first level comprises a maximum super gate.

19. The computer system of claim 16, in which the at least one processor is further to:
determine a statistical distribution for a plurality of locations that include the first location in the design, wherein the second approximate placement of the second number of clustered objects of interest corresponds to a second likelihood of a second location that the second location is covered by at least some of the second number of clustered objects of interest in a second final placement of the second number of clustered objects of interest in the design.

20. The system of claim 16, in which the at least one processor that is to perform the first approximate placement of the first number of clustered objects of interest is further to:
refine the first approximate placement by using a localized gradually refined approximate placement for the first number of clustered objects of interest.

21. The computer system of claim 20, in which the at least one processor is further to:
evaluate the first pool of approximate placement candidates based at least in part upon a first criterion for improving the design.

22. The computer system of claim 16, in which the at least one processor is further to:
perform a second approximate placement of the second number of clustered objects of interest.

* * * * *